United States Patent
Shi et al.

(10) Patent No.: US 11,180,678 B2
(45) Date of Patent: Nov. 23, 2021

(54) SUPPRESSING SIN REMOVAL RATES AND REDUCING OXIDE TRENCH DISHING FOR SHALLOW TRENCH ISOLATION (STI) PROCESS

(71) Applicant: Versum Materials US, LLC, Tempe, AZ (US)

(72) Inventors: Xiaobo Shi, Chandler, AZ (US); Krishna P. Murella, Phoenix, AZ (US); Joseph D. Rose, Gilbert, AZ (US); Hongjun Zhou, Chandler, AZ (US); Mark Leonard O'Neill, Queen Creek, AZ (US)

(73) Assignee: VERSUM MATERIALS US, LLC, Tempe, AZ (US)

( * ) Notice: Subject to any disclaimer, the term of this patent is extended or adjusted under 35 U.S.C. 154(b) by 0 days.

(21) Appl. No.: 16/664,924

(22) Filed: Oct. 27, 2019

(65) Prior Publication Data
US 2020/0131404 A1    Apr. 30, 2020

Related U.S. Application Data

(60) Provisional application No. 62/753,431, filed on Oct. 31, 2018.

(51) Int. Cl.
| | |
|---|---|
| *C09G 1/02* | (2006.01) |
| *C09K 3/14* | (2006.01) |
| *H01L 21/3105* | (2006.01) |
| *B24B 37/04* | (2012.01) |
| *H01L 21/762* | (2006.01) |

(52) U.S. Cl.
CPC .............. *C09G 1/02* (2013.01); *B24B 37/044* (2013.01); *C09K 3/1436* (2013.01); *H01L 21/31053* (2013.01); *H01L 21/76224* (2013.01)

(58) Field of Classification Search
CPC ......... H01L 21/30604; H01L 21/32135; H01L 21/3065; H01L 21/67069; H01L 21/02057; H01L 21/31116; B08B 7/0071
See application file for complete search history.

(56) References Cited

U.S. PATENT DOCUMENTS

| | | | |
|---|---|---|---|
| 5,876,490 A | 3/1999 | Ronay | |
| 6,616,514 B1 | 9/2003 | Edelbach et al. | |
| 6,694,923 B1 | 2/2004 | Fouche | |
| 2004/0152309 A1 | 8/2004 | Carter et al. | |
| 2007/0181534 A1* | 8/2007 | Kamimura | H01L 21/76843 216/88 |
| 2012/0077419 A1 | 3/2012 | Zhang et al. | |
| 2016/0027657 A1* | 1/2016 | Shi | H01L 21/31111 438/693 |
| 2016/0200944 A1 | 7/2016 | Zhou et al. | |
| 2016/0358790 A1 | 12/2016 | Shi et al. | |
| 2017/0283673 A1 | 10/2017 | Zhou et al. | |
| 2018/0002571 A1* | 1/2018 | Stender | C09K 3/1463 |
| 2020/0024481 A1 | 1/2020 | Doi et al. | |

FOREIGN PATENT DOCUMENTS

| | | |
|---|---|---|
| EP | 3101076 A1 | 12/2016 |
| EP | 3263667 A1 | 1/2018 |
| JP | 2015129217 A | 7/2015 |
| KR | 20160079328 A | 7/2016 |
| WO | 2006001558 A1 | 1/2006 |
| WO | 2011005456 A2 | 1/2011 |

OTHER PUBLICATIONS

E.Rafie Borujeny et al. (Ceria coated silica particles: One step preparation and settling behaviour under the influence of colloidal and hydrodynamic interactions, Materials Chemistry and Physics, vol. 173, Apr. 15, 2016, pp. 467-474) (Year: 2016).*
Borujeny, E. R., et al., "Certia coated silica particles: One step preparation and settling behaviour under the influence of colloidal and hydrodynamic interactions," Materials Chemistry and Physics, Apr. 15, 2016, vol. 173, pp. 467-474.

* cited by examiner

*Primary Examiner* — Nadine G Norton
*Assistant Examiner* — Mahmoud Dahimene
(74) *Attorney, Agent, or Firm* — Lina Yang

(57) ABSTRACT

Present invention provides Chemical Mechanical Planarization Polishing (CMP) compositions for Shallow Trench Isolation (STI) applications. The CMP compositions contain ceria coated inorganic oxide particles as abrasives, such as ceria-coated silica particles; chemical additive selected from the group consisting of an organic acetylene molecule containing an acetylene bond and at least two or multi ethoxylate functional groups with terminal hydroxyl groups, an organic molecule with at least two or multi hydroxyl functional groups in the same molecule, and combinations thereof; water soluble solvent; and optionally biocide and pH adjuster; wherein the composition has a pH of 2 to 12, preferably 3 to 10, and more preferably 4 to 9.

16 Claims, No Drawings

SUPPRESSING SIN REMOVAL RATES AND REDUCING OXIDE TRENCH DISHING FOR SHALLOW TRENCH ISOLATION (STI) PROCESS

CROSS REFERENCE TO RELATED APPLICATION(S)

This application claims the benefit of U.S. Provisional Patent Application No. 62/753,431 filed Oct. 31, 2018, which is incorporated herein by reference as if fully set forth.

BACKGROUND OF THE INVENTION

This invention relates to the Shallow Trench Isolation (STI) chemical mechanical planarization (CM P) compositions and chemical mechanical planarization (CMP) for Shallow Trench Isolation (STI) process.

In the fabrication of microelectronics devices, an important step involved is polishing, especially surfaces for chemical-mechanical polishing for recovering a selected material and/or planarizing the structure.

For example, a SiN layer is deposited under a $SiO_2$ layer to serve as a polish stop layer. The role of such polish stop is particularly important in Shallow Trench Isolation (STI) structures. Removal selectivity of silicon oxide:silicon nitride is characteristically expressed as the ratio of the silicon oxide polish rate to the silicon nitride polish rate. An example is an increased polishing selectivity rate of silicon dioxide ($SiO_2$) as compared to silicon nitride (SiN).

In the global planarization of patterned STI structures, reducing SiN film removal rates and reducing oxide trench dishing are two key factors to be considered. The lower trench oxide loss will prevent electrical current leaking between adjacent transistors. Non-uniform trench oxide loss across die (within Die) will affect transistor performance and device fabrication yields. Severe trench oxide loss (high oxide trench dishing) will cause poor isolation of transistor resulting in device failure. Therefore, it is important to reduce trench oxide loss by reducing oxide trench dishing in STI CMP polishing compositions.

U.S. Pat. No. 5,876,490 discloses the polishing compositions containing abrasive particles and exhibiting normal stress effects. The slurry further contains non-polishing particles resulting in reduced polishing rate at recesses, while the abrasive particles maintain high polish rates at elevations. This leads to improved planarization. More specifically, the slurry comprises cerium oxide particles and polymeric electrolyte, and can be used for Shallow Trench Isolation (STI) polishing applications.

U.S. Pat. No. 6,964,923 teaches the polishing compositions containing cerium oxide particles and polymeric electrolyte for Shallow Trench Isolation (STI) polishing applications. Polymeric electrolyte being used includes the salts of polyacrylic acid, similar as those in U.S. Pat. No. 5,876,490. Ceria, alumina, silica & zirconia are used as abrasives. Molecular weight for such listed polyelectrolyte is from 300 to 20,000, but in overall, <100,000.

U.S. Pat. No. 6,616,514 discloses a chemical mechanical polishing slurry for use in removing a first substance from a surface of an article in preference to silicon nitride by chemical mechanical polishing. The chemical mechanical polishing slurry according to the invention includes an abrasive, an aqueous medium, and an organic polyol that does not dissociate protons, said organic polyol including a compound having at least three hydroxyl groups that are not dissociable in the aqueous medium, or a polymer formed from at least one monomer having at least three hydroxyl groups that are not dissociable in the aqueous medium.

However, those prior disclosed Shallow Trench Isolation (STI) polishing compositions did not address the importance of SiN film removal rate suppressing and oxide trench dishing reducing and more uniform oxide trench dishing on the polished patterned wafers along with the high oxide vs nitride selectivity.

Therefore, it should be readily apparent from the foregoing that there remains a need within the art for compositions, methods and systems of STI chemical mechanical polishing that can afford the reduced SiN film removal rates and the reduced oxide trench dishing and more uniformed oxide trench dishing across various sized oxide trench features on polishing patterned wafers in a STI chemical and mechanical polishing (CMP) process, in addition to high removal rate of silicon dioxide as well as high selectivity for silicon dioxide to silicon nitride.

SUMMARY OF THE INVENTION

The present invention provides STI CMP polishing compositions for the suppressed SiN film removal rates and the increased removal selectivity of silicon oxide:silicon nitride (or TEOS:SiN selectivity) and the reduced oxide trench dishing on the polished patterned wafers.

The present invented STI CMP polishing compositions also provides high oxide vs nitride selectivity by introducing chemical additives as SiN film removal rate suppressing agents and oxide trenching dishing reducers in the Chemical mechanical polishing (CMP) compositions for Shallow Trench Isolation (STI) CMP applications at wide pH range including acidic, neutral and alkaline pH conditions.

The disclosed chemical mechanical polishing (CMP) compositions for Shallow Trench Isolation (STI) CMP applications have a unique combination of using ceria-coated inorganic oxide abrasive particles and the suitable chemical additives as oxide trench dishing reducing agents and nitride suppressing agents.

In one aspect, there is provided a STI CMP polishing composition comprises:

ceria-coated inorganic oxide particles;

chemical additive selected from the group consisting of an organic acetylene molecule containing an acetylene bond and at least two ethoxylate functional groups with terminal hydroxyl groups, an organic molecule with at least two hydroxyl functional groups in the same molecule, and combinations thereof;

a water-soluble solvent; and optionally biocide; and pH adjuster;

wherein the composition has a pH of 2 to 12, preferably 3 to 10, more preferably 4 to 9, and most preferably 4.5 to 7.5.

The ceria-coated inorganic oxide particles include, but are not limited to, ceria-coated colloidal silica, ceria-coated high purity colloidal silica, ceria-coated alumina, ceria-coated titania, ceria-coated zirconia, or any other ceria-coated inorganic oxide particles.

The water-soluble solvent includes but is not limited to deionized (DI) water, distilled water, and alcoholic organic solvents.

There are two types or groups of chemical additives.

Group I chemical additives comprise an organic acetylene molecule containing an acetylene bond and at least two or multi ethoxylate functional groups with terminal hydroxyl groups.

Group II of chemical additives comprise at least two or multi hydroxyl groups in the same non-ionic organic molecules.

The chemical additive functions as a SiN film removal rate suppressing agent and oxide trenching dishing reducer.

Group I of the chemical additive comprises an organic acetylene molecule containing an acetylene bond and at least two ethoxylate functional groups with terminal hydroxyl groups has a general molecular structure as shown below:

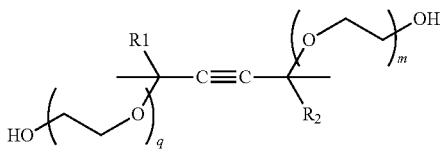

In the general molecular structure, $R_1$ and $R_2$ can be the same or different, and each them is independently selected from alkyl groups $C_nH_{2n+1}$ with straight or branched chains; wherein n is from 1 to 12, preferably 1 to 10, and more preferably 1 to 6.

q and m can be the same or different for the ethoxylate repeating units.

q and m are independently selected from 1 to 100, preferably from 3 to 50, and more preferred from 5 to 30.

Some examples of this type of chemical additives are listed below:

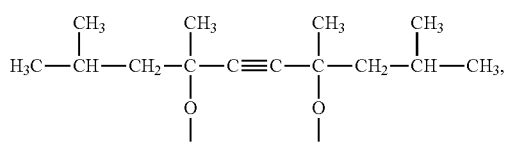

(1)

R = ——(CH$_2$—CH$_2$—O——)$_m$H
R' = ——(CH$_2$—CH$_2$—O——)$_n$H

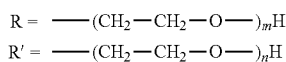

(2)

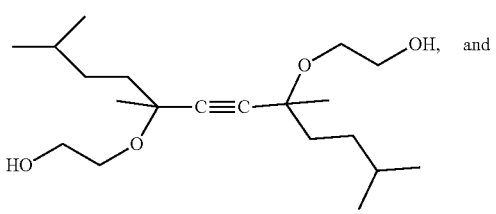

(3)

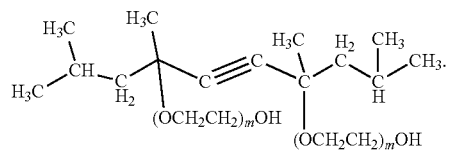

Examples of Group I chemical additives include but are not limited to non-ionic surfactants with different hydrophilic/lipophilic balance (HLB) values (the weight percentages of hydrophilic to hydrophobic groups; for example, hydrophilic part is ethylene oxide and the hydrophobic part is propylene oxide in the structure) depending on the lengths of the repeating ethoxylate units. Different repeating ethoxylate units also provide different solubility in deionized water.

Non-ionic surfactant comprising ethoxylated acetylene glycol, such as ethoxylated acetylene glycol surfactants Dynol™ type or Surfynol® type of the organic surfactants from Evonik are considered and used as Group I chemical additives.

Examples are Dynol™ 604, Dynol™ 607, Dynol™ 800, Dynol™ 810, Surfynol® FS-85, Surfynol® 104, Surfynol® 465; Surfynol® 485, Surfynol® 5160, Surfynol® PSA366; Surfynol® SE; and Surfynol® SE-F.

Dynol™ 607 and Dynol™ 604 comprise structure (2) ethoxylated-2,5,8,11-Tetramethyl-6-Dodecyn-5,8-Dio.

In one embodiment, the chemical additives of Group II has a molecular structure as shown below:

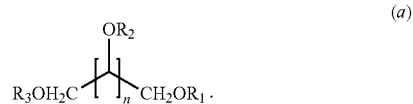

(a)

In the general molecular structure (a), n is selected from 2 to 5,000, preferably from 3 to 12, and more preferably from 4 to 6.

In these general molecular structures; R1, R2, and R3 groups can be the same or different atoms or functional groups.

R1, R2, and R3 can be independently selected from the group consisting of hydrogen, an alkyl group $C_nH_{2n+1}$, n is from 1 to 12, preferably 1 to 6, and more preferably 1 to 3; alkoxy, organic group with one or more hydroxyl groups, substituted organic sulfonic acid, substituted organic sulfonic acid salt, substituted organic carboxylic acid, substituted organic carboxylic acid salt, organic carboxylic ester, organic amine groups, and combinations thereof; wherein, at least two are hydrogen atoms.

In another embodiment, Group II chemical additive has a general structure shown below:

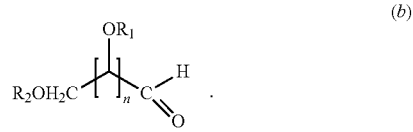

(b)

In this structure, one —CHO functional group is located at one end of the molecule as the terminal functional group; n is selected from 2 to 5,000, from 3 to 12, preferably from 4 to 7.

Each of R1 and R2 can be independently selected from the group consisting of hydrogen, alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester, organic amine groups, and combinations thereof.

In yet another embodiment, the chemical additives of Group II has a molecular structure selected from the group comprising of at least one (c), at least one (d), at least one (e) and combinations thereof;

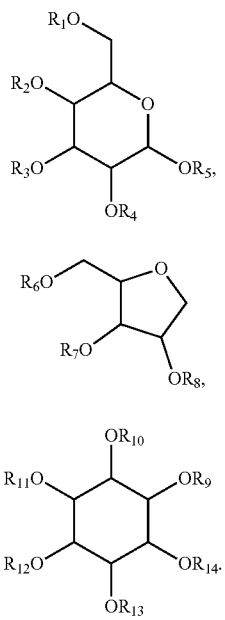

In these general molecular structures; $R_1$, $R_2$, $R_3$, $R_4$, $R_5$, $R_6$, $R_7$, $R_8$, $R_9$, $R_{10}$, $R_{11}$, $R_{12}$, $R_{13}$, and $R_{14}$ can be the same or different atoms or functional groups.

They can be independently selected from the group consisting of hydrogen, alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester, organic amine groups, and combinations thereof; wherein, at least two or more, preferably four or more of them are hydrogen atoms.

Yet, in another embodiment, the Group II chemical additives contain at least one six-member ring structure motif ether bonded with at least one polyol molecular unit containing multiple hydroxyl functional groups in the molecular unit structures or at least one polyol molecular unit containing multiple hydroxyl functional groups in the molecular unit structures and at least one six-member ring polyol. A polyol is an organic compound containing hydroxyl groups.

The general molecular structure for the chemical additives is shown in (f):

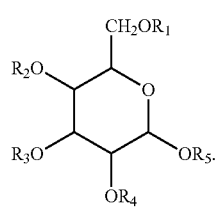

In structure (f), at least one R in the group of R1 to R5 in the general molecular structure (f) is a polyol molecular unit having a structure shown in (i):

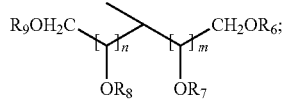

wherein n and m can be the same or different. m or n is independently selected from 1 to 5, preferably from 1 to 4, more preferably from 1 to 3, and most preferably from 1 to 2; $R_6$ to $R_9$ can be the same or different atoms or functional groups; each of $R_6$, $R_7$, $R_8$, and $R_9$ is independently selected from the group consisting of hydrogen, alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester, organic amine, and combinations thereof; and at least two of them are hydrogen atoms; and the rest of each Rs in the group of R1 to R5 can be independently selected from the group consisting of hydrogen, alkyl, alkoxy, organic group with one or more hydroxyl groups, substituted organic sulfonic acid or salt, substituted organic carboxylic acid or salt, organic carboxylic ester, organic amine, a six-member ring polyol having a structure shown in (ii):

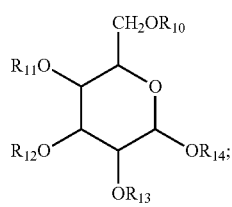

wherein the structure (ii) is connected through oxygen carbon bond to structure (f) by removing one R from $R_{11}$ to $R_{14}$ in (ii) and each of the rest $R_{10}$ to $R_{14}$ is independently selected from the group consisting of hydrogen, alkyl, alkoxy, organic group with one or more hydroxyl groups, substituted organic sulfonic acid or salt, substituted organic carboxylic acid or salt, organic carboxylic ester, organic amine, and combinations thereof;
and combinations thereof.

The general molecular structure (f) has at least two, at least four, or at least six of the Rs in the group of R1 to R9 are hydrogen atoms. Thus the chemical additives contain at least two, at least four, or at least six hydroxyl functional groups in their molecular structures.

Examples of Group II chemical additives comprise maltitol, lactitol, maltotritol, ribitol, D-sorbitol, mannitol, dulcitol, iditol, D-(−)-Fructose, sorbitan, sucrose, ribose, Inositol, glucose, D-arabinose, L-arabinose, D-mannose, L-mannose, meso-erythritol, beta-lactose, arabinose, and combinations thereof. The preferred chemical additives are maltitol, lactitol, maltotritol, D-sorbitol, mannitol, dulcitol, iditol, D-(−)-Fructose, sucrose, ribose, Inositol, glucose. D-(+)-mannose, beta-lactose, and combinations thereof. The more preferred chemical additives are maltitol, lactitol, maltotritol, D-sorbitol, mannitol, dulcitol, D-(−)-Fructose, beta-lactose, and combinations thereof.

In some embodiments, the CMP polishing compositions can be made into two or more components and mixed at the point of use.

In another aspect, there is provided a method of chemical mechanical polishing (CMP) a substrate having at least one surface comprising silicon dioxide using the chemical mechanical polishing (CMP) composition described above in Shallow Trench Isolation (STI) process.

In another aspect, there is provided a system of chemical mechanical polishing (CMP) a substrate having at least one surface comprising silicon dioxide using the chemical mechanical polishing (CMP) composition described above in Shallow Trench Isolation (STI) process.

The polished oxide films can be Chemical vapor deposition (CVD), Plasma Enhance CVD (PECVD), High Density Deposition CVD(HDP), or spin on oxide films.

The substrate disclosed above can further comprises a silicon nitride surface. The removal selectivity of $SiO_2$:SiN is greater than 30, preferably greater than 60, and more preferably greater than 100.

DETAILED DESCRIPTION OF THE INVENTION

In the global planarization of patterned STI structures, suppressing SiN removal rates and reducing oxide trench dishing across various sized oxide trench features are key factors to be considered. The lower trench oxide loss will prevent electrical current leaking between adjacent transistors. Non-uniform trench oxide loss across die (within Die) will affect transistor performance and device fabrication yields. Severe trench oxide loss (high oxide trench dishing) will cause poor isolation of transistor resulting in device failure. Therefore, it is important to reduce trench oxide loss by reducing oxide trench dishing in STI CMP polishing compositions.

This invention relates to the Chemical mechanical polishing (CMP) compositions for Shallow Trench Isolation (STI) CMP applications.

More specifically, the disclosed chemical mechanical polishing (CMP) composition for Shallow Trench Isolation (STI) CMP applications have a unique combination of using ceria-coated inorganic oxide abrasive particles and the suitable chemical additives as oxide trench dishing reducing agents and nitride removal rate suppressing agents.

The suitable chemical additives include but are not limited to an organic acetylene molecule containing an acetylene bond and at least two ethoxylate functional groups with terminal hydroxyl groups (Group I); an organic molecules which bearing at least two hydroxyl functional groups on the same molecules(Group II); and combinations thereof.

The use of both groups of chemical additives in the STI CMP polishing compositions provides the benefits of achieving high oxide film removal rates, low SiN film removal rates, high and tunable Oxide:SiN selectivity, and more importantly, providing significantly reduced oxide trench dishing and improving over polishing window stability on polishing patterned wafers.

In one aspect, there is provided a STI CMP polishing composition comprises:
ceria-coated inorganic oxide particles;
chemical additive selected from the group consisting of an organic acetylene molecule containing an acetylene bond and at least two ethoxylate functional groups with terminal hydroxyl groups; an organic molecule with at least two hydroxyl functional groups in the same molecule; and combinations thereof;
a water soluble solvent; and
optionally
biocide; and
pH adjuster;
wherein the composition has a pH of 2 to 12, preferably 3 to 10, more preferably 4 to 9, and most preferably 4.5 to 7.5.

The ceria-coated inorganic oxide particles include, but are not limited to, ceria-coated colloidal silica, ceria-coated high purity colloidal silica, ceria-coated alumina, ceria-coated titania, ceria-coated zirconia, or any other ceria-coated inorganic oxide particles.

The particle sizes of these ceria-coated inorganic oxide particles in the disclosed invention herein are ranged from 10 nm to 1,000 nm, the preferred mean particle sized are ranged from 20 nm to 500 nm, the more preferred mean particle sizes are ranged from 50 nm to 250 nm.

The concentrations of these ceria-coated inorganic oxide particles range from 0.01 wt. % to 20 wt. %, the preferred concentrations range from 0.05 wt. % to 10 wt. %, the more preferred concentrations range from 0.1 wt. % to 5 wt. %.

The preferred ceria-coated inorganic oxide particles are ceria-coated colloidal silica particles.

The water soluble solvent includes but is not limited to deionized (DI) water, distilled water, and alcoholic organic solvents.

The preferred water soluble solvent is DI water.

The STI CMP composition may contain biocide from 0.0001 wt. % to 0.05 wt. %; preferably from 0.0005 wt. % to 0.025 wt. %, and more preferably from 0.001 wt. % to 0.01 wt. %.

The biocide includes, but is not limited to, Kathon™, Kathon™ CG/ICP II, from Dupont/Dow Chemical Co. Bioban from Dupont/Dow Chemical Co. They have active ingredients of 5-chloro-2-methyl-4-isothiazolin-3-one and 2-methyl-4-isothiazolin-3-one.

The STI CMP composition may contain a pH adjusting agent.

An acidic or basic pH adjusting agent can be used to adjust the STI polishing compositions to the optimized pH value.

The pH adjusting agents include, but are not limited to nitric acid, hydrochloric acid, sulfuric acid, phosphoric acid, other inorganic or organic acids, and mixtures thereof.

pH adjusting agents also include the basic pH adjusting agents, such as sodium hydroxide, potassium hydroxide, ammonium hydroxide, tetraalkyl ammonium hydroxide, organic quaternary ammonium hydroxide compounds, organic amines, and other chemical reagents that can be used to adjust pH towards the more alkaline direction.

The STI CMP composition contains 0 wt. % to 1 wt. %; preferably 0.01 wt. % to 0.5 wt. %; more preferably 0.1 wt. % to 0.25 wt. % pH adjusting agent.

There are two groups of chemical additives.

Group I chemical additives comprise an organic acetylene molecule containing an acetylene bond and at least two or multi ethoxylate functional groups with terminal hydroxyl groups.

More specifically, group I of chemical additives comprise at least one carbon to carbon triple bond with a straight chain or branched chain alkyl groups connected to the carbon atoms which forms the triple bond with another carbon atom, and with ethoxylate repeating units connected to the carbon atoms which forms the triple bond with another carbon atom, and with some hydroxyl functional groups as terminal groups.

Group II of chemical additives comprise at least two or multi hydroxyl groups in the same non-ionic organic molecules.

The STI CMP composition contains 0.0001 wt. % to 1.0 wt. %, preferably 0.0005 wt. % to 0.5 wt. %, more preferable 0.001 wt. % to 0.25 wt. %, and most preferably 0.002 wt. % to 0.15 wt. % Group I chemical additives.

The STI CMP composition contains 0.001 wt. % to 2.0 wt. %, preferably 0.0025 wt. % to 1.0 wt. %, and preferable 0.05 wt. % to 0.5 wt. % Group II chemical additive.

The chemical additive that is an organic acetylene molecule containing an acetylene bond and at least two ethoxylate functional groups with terminal hydroxyl groups has the general molecular structure as shown below:

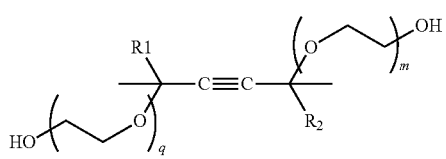

In the general molecular structure, $R_1$ and $R_2$ can be the same or different, and each them is independently selected from alkyl groups $C_nH_{2n+1}$ with straight or branched chains; wherein n is from 1 to 12, preferably 1 to 10, and more preferably 1 to 6.

For the ethoxylate groups, q and m can be the same or different.

q and m are independently selected from 1-100, preferably from 3-50, and more preferred from 5 to 30.

Some examples of this type of chemical additives are listed below:

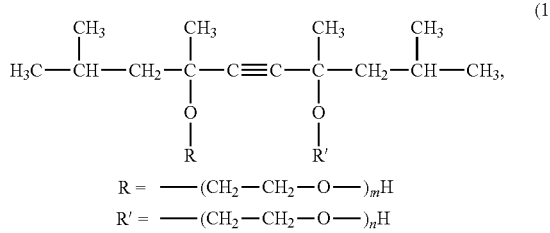

(1)

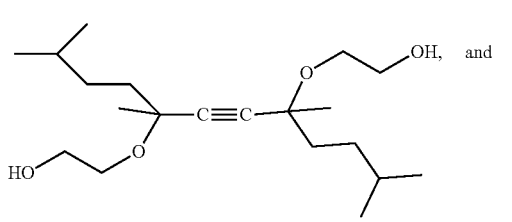

(2)

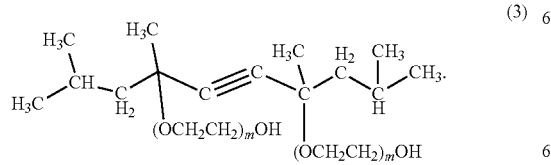

(3)

Examples of Group I chemical additives include but are not limited to non-ionic surfactants with different hydrophilic/lipophilic balance (HLB) values (the weight percentages of hydrophilic to hydrophobic groups; for example, hydrophilic part is ethylene oxide and the hydrophobic part is propylene oxide in the structure) depending on the lengths of the repeating ethoxylate units. Different repeating ethoxylate units also provide different solubility in deionized water.

Ethoxylated acetylene glycol surfactants Dynol™ type or Surfynol® type of the organic surfactants from Evonik are considered and used as Group I chemical additives.

For example, Dynol™ 607 and Dynol™ 604 comprise structure (2) ethoxylated-2,5,8,11-Tetramethyl-6-Dodecyn-5,8-Diol.

In one embodiment, the chemical additives of Group II has a molecular structure as shown below:

(a)

In the general molecular structure (a), n is selected from 2 to 5,000, preferably from 3 to 12, and more preferably from 4 to 6.

In these general molecular structures; R1, R2, and R3 groups can be the same or different atoms or functional groups.

R1, R2, and R3 can be independently selected from the group consisting of hydrogen, an alkyl group $C_nH_{2n+1}$, n is from 1 to 12, preferably 1 to 6, and more preferably 1 to 3; alkoxy, organic group with one or more hydroxyl groups, substituted organic sulfonic acid, substituted organic sulfonic acid salt, substituted organic carboxylic acid, substituted organic carboxylic acid salt, organic carboxylic ester, organic amine groups, and combinations thereof; wherein, at least two or more, preferably four or more, are hydrogen atoms.

When R1, R2, and R3 are all hydrogen atoms and n is ≥2, the chemical additive bear at least two hydroxyl functional groups. The molecular structures of some examples of such chemical additives are listed below:

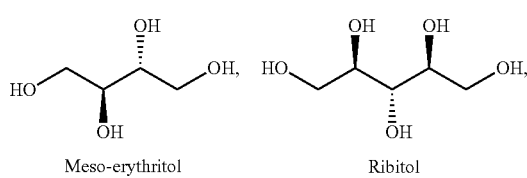

Meso-erythritol      Ribitol

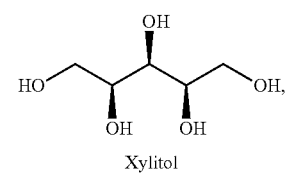

Xylitol

-continued

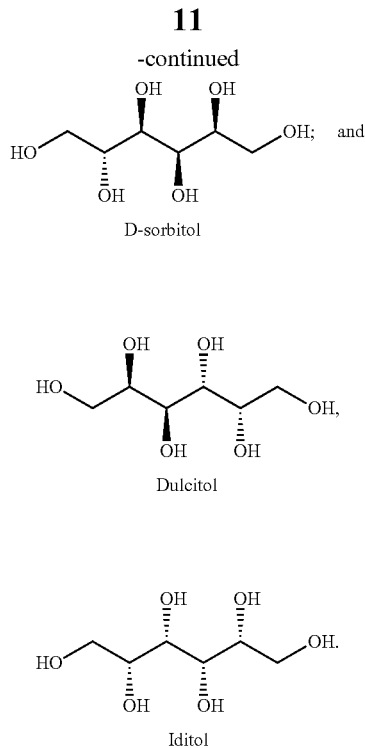

D-sorbitol

Dulcitol

Iditol

In another embodiment, Group II chemical additive has a general structure shown below:

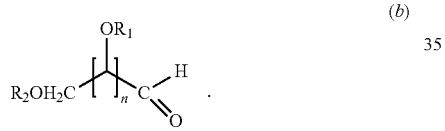
(b)

In this structure, one —CHO functional group is located at one end of the molecule as the terminal functional group; n is selected from 2 to 5,000, from 3 to 12, preferably from 4 to 7.

Each of R1 and R2 can be independently selected from the group consisting of hydrogen, alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester, organic amine groups, and combinations thereof.

When R1 and R2 are all hydrogen atoms, and n=3, the chemical additive is D-arabinose or L-arabinose:

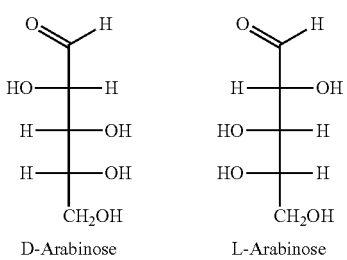

D-Arabinose    L-Arabinose

When R1 and R2 are all hydrogen atoms, and n=4, the chemical additive is D-mannose or L-mannose:

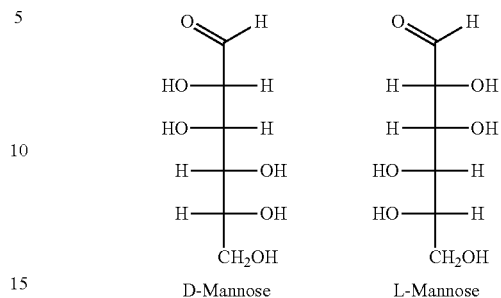

D-Mannose    L-Mannose

In yet another embodiment, the chemical additives of Group II has a molecular structure selected from the group comprising of at least one (c), at least one (d), at least one (e) and combinations thereof;

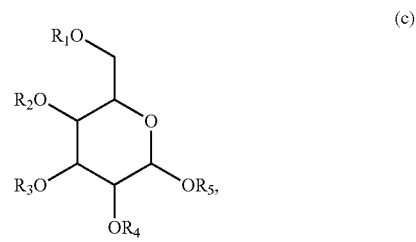
(c)

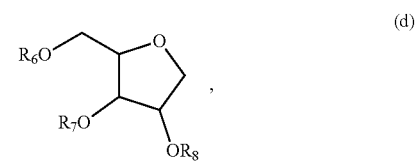
(d)

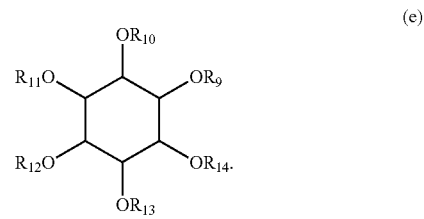
(e)

In these general molecular structures; R1, R2, R3, R4, R5, R6, R7, R8, R9, R10, R11, R12, R13, and R14 can be the same or different atoms or functional groups.

They can be independently selected from the group consisting of hydrogen, alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester, organic amine groups, and combinations thereof; wherein, at least two or more, preferably four or more of them are hydrogen atoms.

When R1, R2, R3 R4, R5, R6, R7 R8, R9, R10, R11, R12, R13, and R14 are all hydrogen atoms which provide the chemical additives bearing at least two hydroxyl functional groups.

The molecular structures of some examples of such chemical additives are listed below:

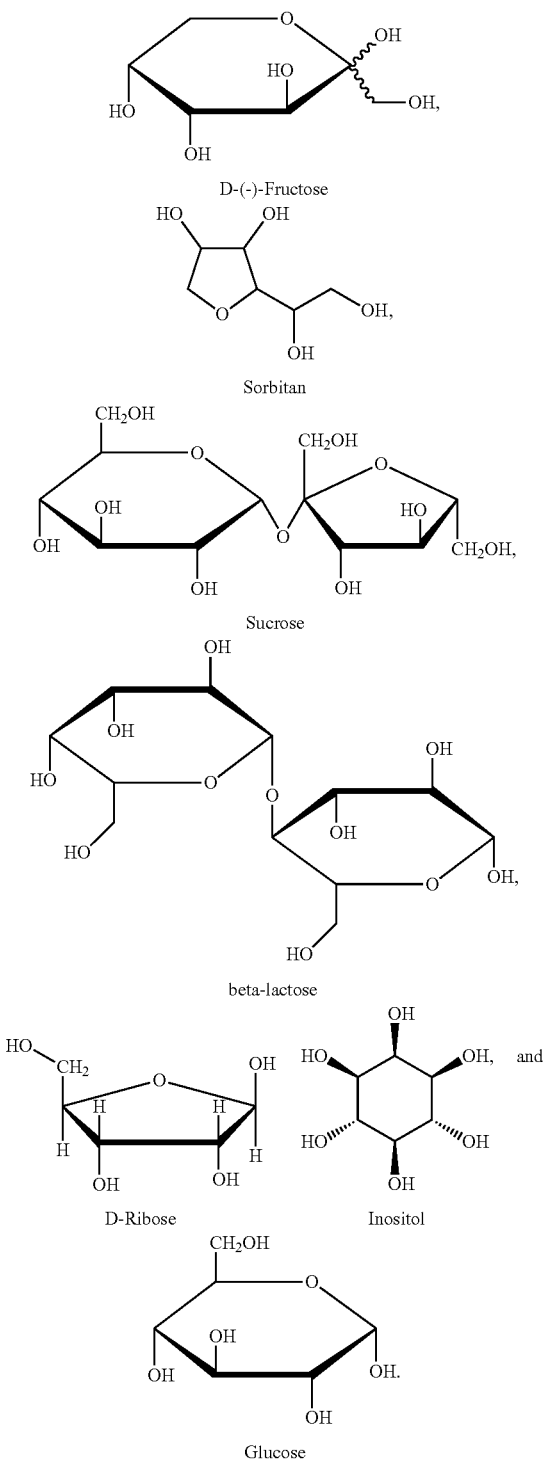

Yet, in another embodiment, the Group II chemical additives contain at least one six-member ring structure motif ether bonded with at least one polyol molecular unit containing multiple hydroxyl functional groups in the molecular unit structures or at least one polyol molecular unit containing multiple hydroxyl functional groups in the molecular unit structures and at least one six-member ring polyol. A polyol is an organic compound containing hydroxyl groups.

The chemical additives contain at least two, at least four, or at least six hydroxyl functional groups in their molecular structures.

The general molecular structure for the chemical additives is shown in (f):

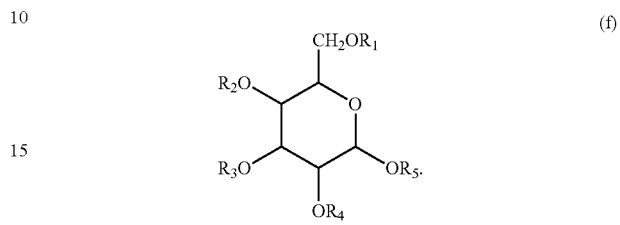

In structure (f), at least one R in the group of R1 to R5 in the general molecular structure (f) is a polyol molecular unit having a structure shown in (i):

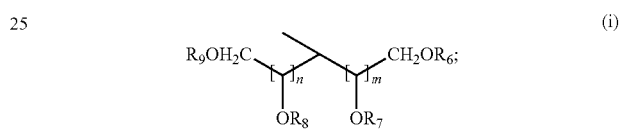

wherein n and m can be the same or different. m or n is independently selected from 1 to 5, preferably from 1 to 4, more preferably from 1 to 3, and most preferably from 1 to 2; R6 to R9 can be the same or different atoms or functional groups; and the rest of each Rs in the group of R1 to R5 can be independently selected from the group consisting of hydrogen, alkyl, alkoxy, organic group with one or more hydroxyl groups, substituted organic sulfonic acid or salt, substituted organic carboxylic acid or salt, organic carboxylic ester, organic amine, a six-member ring polyol having a structure shown in (ii):

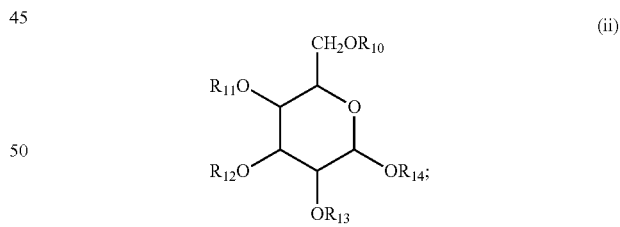

wherein the structure (ii) is connected through oxygen carbon bond to structure (f) by removing one R from $R_{11}$ to $R_{14}$ in (ii) and each of the rest $R_{10}$ to $R_{14}$ is independently selected from the group consisting of hydrogen, alkyl, alkoxy, organic group with one or more hydroxyl groups, substituted organic sulfonic acid or salt, substituted organic carboxylic acid or salt, organic carboxylic ester, organic amine, and combinations thereof;
and combinations thereof.

In the general molecular structure (f) having at least one R with structure (i), at least two, preferably four, more preferably six of the Rs in the group of R1 to R9 are hydrogen atoms.

In the general molecular structure (f), when only one R, such as R5 in the group of R1 to R5 is a polyol molecular having structure (i) with n=2 and m=1; and the rest of Rs in the group of R1 to R9 are all hydrogen atoms, the following two chemical additives are obtained:

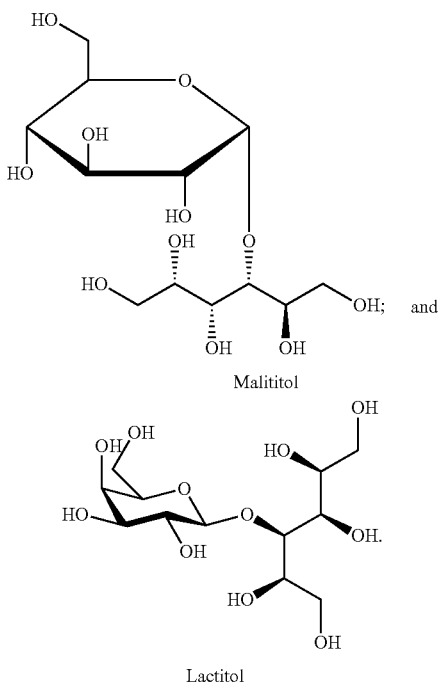

Malititol

Lactitol

In the general molecular structure (f), when one R, such as R5 is a polyol molecular structure (i) having n=2 and m=1; and one R, such as R2 is a six-member ring polyol structure (ii); structure (ii) is connected through oxygen carbon bond to structure (f) by removing —R14 in (ii); and all rest of Rs in the group of R1 to R14 are all hydrogen atoms, the following chemical additive is obtained:

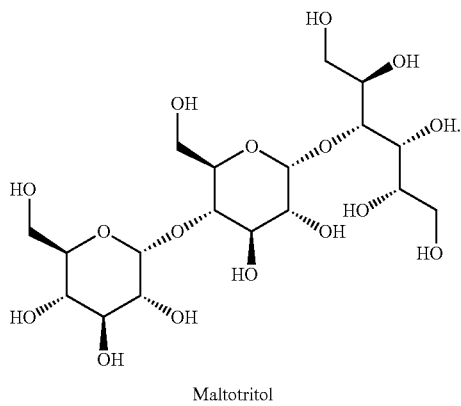 [SMILES: OC[C@@H](O)[C@@H](O[C@H]1O[C@H](CO)[C@@H](O[C@H]2O[C@H](CO)[C@@H](O)[C@H](O)[C@H]2O)[C@H](O)[C@H]1O)[C@H](O)[C@@H](O)CO]

Maltotritol

The chemical additive of Group I comprises various Dynol™ type or Surfynol® type of the organic surfactants, such as Dynol™ 604, Dynol™ 607, Dynol™ 800, Dynol™ 810, Surfynol® 104, Surfynol® 486, and Surfynol® 5160 etc.

The chemical additive of Group II comprises maltitol, lactitol, maltotritol, ribitol, D-sorbitol, mannitol, dulcitol, iditol, D-(-)-Fructose, sorbitan, sucrose, ribose, Inositol, glucose, D-arabinose, L-arabinose, D-mannose, L-mannose, meso-erythritol, beta-lactose, arabinose, and combinations thereof. The preferred chemical additives are maltitol, lactitol, maltotritol, D-sorbitol, mannitol, dulcitol, iditol, D-(-)-Fructose, sucrose, ribose, Inositol, glucose. D-(+)-mannose, beta-lactose, and combinations thereof. The more preferred chemical additives are maltitol, lactitol, maltotritol, D-sorbitol, mannitol, dulcitol, D-(-)-Fructose, beta-lactose, and combinations thereof.

In some embodiments, the CMP polishing compositions can be made into two or more components and mixed at the point of use.

In another aspect, there is provided a method of chemical mechanical polishing (CMP) a substrate having at least one surface comprising silicon dioxide using the chemical mechanical polishing (CMP) composition described above in Shallow Trench Isolation (STI) process.

In another aspect, there is provided a system of chemical mechanical polishing (CMP) a substrate having at least one surface comprising silicon dioxide using the chemical mechanical polishing (CMP) composition described above in Shallow Trench Isolation (STI) process.

The polished oxide films can be Chemical vapor deposition (CVD), Plasma Enhance CVD (PECVD), High Density Deposition CVD(HDP), or spin on oxide films.

The substrate disclosed above can further comprises a silicon nitride surface. The removal selectivity of $SiO_2$:SiN is greater than 30, preferably greater than 60, and more preferably greater than 100.

In another aspect, there is provided a method of chemical mechanical polishing (CMP) a substrate having at least one surface comprising silicon dioxide using the chemical mechanical polishing (CMP) composition described above in Shallow Trench Isolation (STI) process. The polished oxide films can be CVD oxide, PECVD oxide, High density oxide, or Spin on oxide films.

The following non-limiting examples are presented to further illustrate the present invention.

CMP Methodology

In the examples presented below, CMP experiments were run using the procedures and experimental conditions given below.

Glossary

Components

Ceria-coated Silica: used as abrasive having a particle size of approximately 100 nanometers (nm); such ceria-coated silica particles can have a particle size of ranged from approximately 20 nanometers (nm) to 500 nanometers (nm);

Ceria-coated Silica particles (with varied sizes) were supplied by JGCC Inc. in Japan.

Chemical additives, such as different Dynol™ type or Surfynol® type of the organic surfactants were supplied by Evonik Industries in Allentown, Pa.; while maltitol, D-Fructose, Dulcitol, D-sorbitol and other chemical raw materials were supplied by Sigma-Aldrich, St. Louis, Mo.

TEOS: tetraethyl orthosilicate
Polishing Pad: Polishing pad, IC1010, IC1000 and other pads were used during CMP, supplied by DOW, Inc.

PARAMETERS

General

Å or A: angstrom(s)—a unit of length
BP: back pressure, in psi units
CMP: chemical mechanical planarization=chemical mechanical polishing
CS: carrier speed
DF: Down force: pressure applied during CMP, units psi
min: minute(s)
ml: milliliter(s)
mV: millivolt(s)
psi: pounds per square inch
PS: platen rotational speed of polishing tool, in rpm (revolution(s) per minute)
SF: composition flow, ml/min
Wt. %: weight percentage (of a listed component)
TEOS:SiN Selectivity: (removal rate of TEOS)/(removal rate of SiN)
HDP: high density plasma deposited TEOS
TEOS or HDP Removal Rates: Measured TEOS or HDP removal rate at a given down pressure. The down pressure of the CMP tool was 2.0, 3.0 or 4.0 psi in the examples listed above.
SiN Removal Rates: Measured SiN removal rate at a given down pressure. The down pressure of the CMP tool was 3.0 psi in the examples listed.
Removal Selectivity of silicon oxide:silicon nitride (or TEOS:SiN Selectivity): (removal rate of TEOS)/(removal rate of SiN).

Metrology

Films were measured with a ResMap CDE, model 168, manufactured by Creative Design Engineering, Inc, 20565 Alves Dr., Cupertino, Calif., 95014. The ResMap tool is a four-point probe sheet resistance tool. Forty-nine-point diameter scan at 5 mm edge exclusion for film was taken.

CMP Tool

The CMP tool that was used is a 200 mm Mirra, or 300 mm Reflexion manufactured by Applied Materials, 3050 Boweres Avenue, Santa Clara, Calif., 95054. An IC1000 pad supplied by DOW, Inc, 451 Bellevue Rd., Newark, Del. 19713 was used on platen 1 for blanket and pattern wafer studies.
The IK4250UH pad or other pad was broken in by conditioning the pad for 18 mins. At 7 lbs. down force on the conditioner. To qualify the tool settings and the pad break-in two tungsten monitors and two TEOS monitors were polished with Versum® STI2305 composition, supplied by Versum Materials Inc. at baseline conditions.

Wafers

Polishing experiments were conducted using PECVD or LECVD or HD TEOS wafers. These blanket wafers were purchased from Silicon Valley Microelectronics, 2985 Kifer Rd., Santa Clara, Calif. 95051.

Polishing Experiments

In blanket wafer studies, oxide blanket wafers, and SiN blanket wafers were polished at baseline conditions. The tool baseline conditions were: table speed; 87 rpm, head speed: 93 rpm, membrane pressure; 2.0 psi or 3.0 psi DF, composition flow; 200 ml/min. The polishing pad used for testing was IK4250UH pad which was supplied by Dow Chemicals.

Deionized water was used as the solvent in the compositions in the working examples.

The composition was used in polishing experiments on patterned wafers (MIT860), supplied by SWK Associates, Inc. 2920 Scott Blvd. Santa Clara, Calif. 95054). These wafers were measured on the Veeco VX300 profiler/AFM instrument. The 3 different sized pitch structures were used for oxide dishing measurement. The wafer was measured at center, middle, and edge die positions.

WORKING EXAMPLES

In the following working examples, all STI polishing composition comprised a very low concentration of biocide ranging from 0.0001 wt. % to 0.05 wt. %, and deionized water.

Example 1

In Example 1, the polishing compositions used for oxide polishing were shown in Table 1.

0.2 wt. % ceria-coated silica particles, very low concentration of biocide, and DI water were used in all compositions. All compositions had same pH values at around 5.35.

Maltitol was used at 0.28 wt. %, and Surfynol® PSA336 or Surfynol® FS-85 was used at 0.05 wt. % or 0.012 wt. % respectively in the testing samples.

The removal rates (RR at Å/min) for different films were tested. The effects of chemical additives on the film removal rates and TEOS:SiN film selectivity were observed and listed in Table 1.

TABLE 1

Effects of Chemical Additives on Film RR (Å/min.) & TEOS: SiN Selectivity

| Compositions | TEOS-RA (ang./min) | HDP-RR (ang./min) | PECVD SiN-RR (ang./min) | TEOS: SiN Selectivity |
|---|---|---|---|---|
| 0.2% Ceria-coated Silica + 0.28% Maltitol | 6673 | 6538 | 86 | 78:1 |
| 0.2% Ceria-coated Silica + 0.28% Maltitol + 0.05% Surfynol ® PSA336 | 1694 | 2768 | 57 | 30:1 |
| 0.2% Ceria-coated Silica + 0.28% Maltitol + 0.012% Surfynol ® FS-85 | 6234 | 6074 | 44 | 142:1 |

The polishing step conditions used were: Dow's IK4250UH pad at 3.0 psi DF with table/head speed at 87/93 rpm and ex-situ conditioning.

As the results shown in Table 1, the use of dual chemical additives in the polishing composition effectively suppressed SiN film removal rates. The TEOS:SiN selectivity was increased.

Specifically, the addition of Surfynol® FS-85 at 0.012 wt. % concentration in the polishing composition, it not only suppressed SiN film removal rate by about 49%, but also increased TEOS:SiN selectivity from 78:1 to 142:1.

Example 2

In Example 2, the polishing compositions used for polishing were shown in Table 2.

0.2 wt. % ceria-coated silica particles, very low concentration of biocide, and DI water were used in all compositions. All compositions had same pH values at around 5.35.

Surfynol® type of surfactants were used at 0.05 wt. % or 0.012 wt. % respectively in the testing samples.

The effects of chemical additives on the oxide trenching dishing vs different over polishing times were tested and the results were listed in Table 2.

TABLE 2

Effects of Chemical Additives on Oxide Trench Dishing (Å) vs OP Times (Sec.)

| Compositions | OP Times (Sec.) | 100 um pitch dishing | 200 um pitch dishing | HDP-RR (ang./min) |
|---|---|---|---|---|
| 0.2% Ceria-coated Silica + 0.28% Maltitol | 0 | 136 | 225 | 6538 |
|  | 60 | 278 | 443 |  |
|  | 120 | 399 | 576 |  |
| 0.2% Ceria-coated Silica + 0.28% Maltitol + 0.05% Surfynol® PSA336 | 0 | 64 | 176 | 2768 |
|  | 60 | 172 | 318 |  |
|  | 120 | 304 | 448 |  |
| 0.2% Ceria-coated Silica + 0.28% Maltitol + 0.012% Surfynol® FS-85 | 0 | 61 | 186 | 6074 |
|  | 60 | 182 | 338 |  |
|  | 120 | 308 | 495 |  |

As the results shown in Table 2, the use of dual chemical additives i.e., the addition of Surfynol® FX-85 or Surfynol® PSA336 as the chemical additive in the polishing compositions reduced oxide trench dishing vs different over polishing times.

The polishing conditions used for patterned wafer polishing were: Dow's IK4250UH pad with 2.0 psi down force with table/head speeds at 87/93 rpm, and with exsitu conditioning.

The effects of chemical additives on the oxide trenching loss rates (A/sec.) were tested and the results were listed in Table 3.

As the results shown in Table 3, the use of dual chemical additives i.e., the addition of Surfynol® FX-85 or Surfynol® PSA336 as the second chemical additive in the polishing compositions reduced oxide trench loss rates across different sized oxide trench features.

TABLE 3

Effects of Chemical Additives on Oxide Trench Loss Rates (Å/sec.)

| Compositions | P100 Oxide Trench Loss Rate (ang./sec.) | P200 Oxide Trench Loss Rate (ang./sec.) | P1000 Oxide Trench Loss Rate (ang./sec.) |
|---|---|---|---|
| 0.2% Ceria-coated Silica + 0.28% Maltitol | 3.7 | 4.1 | 6.2 |
| 0.2% Ceria-coated Silica + 0.28% Maltitol + 0.05% Surfynol® PSA336 | 2.9 | 3.3 | 5.0 |
| 0.2% Ceria-coated Silica + 0.28% Maltitol + 0.012% Surfynol® FS-85 | 3.1 | 3.5 | 4.9 |

The effects of chemical additives on the SiN loss rates (A/min.) on different sized patterned features were tested and the results were listed in Table 4.

TABLE 4

Effects of Chemical Additives on SiN Loss Rates (Å/sec.)

| Compositions | P100 SiN Loss Rate (ang./sec.) | P200 SiN Loss Rate (ang./sec.) | P1000 SiN Loss Rate (ang./sec.) |
|---|---|---|---|
| 0.2% Ceria-coated Silica + 0.28% Maltitol | 1.2 | 1.1 | 1.1 |
| 0.2% Ceria-coated Silica + 0.28% Maltitol + 0.05% Surfynol® PSA336 | 0.8 | 0.7 | 0.7 |
| 0.2% Ceria-coated Silica + 0.28% Maltitol + 0.012% Surfynol® FS-85 | 0.9 | 0.9 | 0.9 |

As the results shown in Table 4, the use of dual chemical additives i.e., the addition of Surfynol® FX-85 or Surfynol® PSA336 as the second chemical additive in the polishing compositions reduced SiN loss rates across different sized patterned features.

The effects of chemical additives as the additives on the oxide trenching dishing rates (A/sec.) were tested and the results were listed in Table 5.

As the results shown in Table 5, the use of dual chemical additives i.e., the addition of Surfynol® FS-85 or Surfynol® PSA336 as the second chemical additive in the polishing compositions reduced oxide trench dishing rates across different sized oxide trench features.

TABLE 5

Effects of Chemical Additives on Oxide Trench Dishing Rates (Å/sec.)

| Compositions | P100 Oxide Trench Dishing Rate (Å/sec.) | P200 Oxide Trench Dishing Rate (Å/sec.) | P1000 Oxide Trench Dishing Rate (Å/sec.) |
|---|---|---|---|
| 0.2% Ceria-coated Silica + 0.28% Maltitol | 2.2 | 2.9 | 5.3 |
| 0.2% Ceria-coated Silica + 0.28% | 2.0 | 2.3 | 4.6 |

TABLE 5-continued

Effects of Chemical Additives
on Oxide Trench Dishing Rates (Å/sec.)

| Compositions | P100 Oxide Trench Dishing Rate (Å/sec.) | P200 Oxide Trench Dishing Rate (Å/sec.) | P1000 Oxide Trench Dishing Rate (Å/sec.) |
| --- | --- | --- | --- |
| Maltitol + 0.05% Surfynol ® P5A336 | | | |
| 0.2% Ceria-coated Silica + 0.28% Maltitol + 0.012% Surfynol ® FS-85 | 2.1 | 2.6 | 4.4 |

Example 3

In Example 3, the polishing compositions used for polishing were shown in Table 6.

0.2 wt. % ceria-coated silica particles, very low concentration of biocide, and DI water were used in all compositions. All compositions had same pH values at around 5.35.

TABLE 6

Effects of Surfynol ® FS-85 on Film RR
(Å/min.) & TEOS: SiN Selectivity

| Compositions | TEOS-RR (Å/min) | HDP-RR (Å/min) | PECVD SiN-RR (Å/min) | TEOS: SiN Selectivity |
| --- | --- | --- | --- | --- |
| 0.2% Ceria-coated Silica + 0.28% Maltitol | 4637 | 4364 | 49 | 95:1 |
| 0.2% Ceria-coated Silica + 0.28% Maltitol + 0.006% Surfynol ® FS-85 | 3831 | 3770 | 33 | 116:1 |
| 0.2% Ceria-coated Silica + 0.28% Maltitol + 0.012% Surfynol ® FS-85 | 3808 | 3747 | 29 | 131:1 |
| 0.2% Ceria-coated Silica + 0.28% Maltitol + 0.024% Surfynol ® FS-85 | 3744 | 3356 | 32 | 117:1 |

Maltitol was used at 0.28 wt. %, and Surfynol® FS-85 was used at 0.006 wt. %, 0.012 wt. %, or 0.024 wt. % respectively in the testing samples.

The polishing parts and conditions were: Dow's IK4250UH polishing pad, 2.0 psi DF, ex-situ conditioning and with 87/93 rpm table/head speeds.

The removal rates (RR at Å/min) for different films were tested. The effects of the chemical additive Surfynol® FS-85 with different concentrations on the film removal rates and TEOS:SiN selectivity were observed and listed in Table 6.

As the results shown in Table 6, the use of dual chemical additives i.e., the addition of Surfynol® FS-85 at three different concentrations as Group 1 chemical additive in the polishing compositions suppressed SiN film removal rates and increased TEOS:SiN selectivity.

Example 4

In Example 4, the polishing compositions used for polishing were shown in Table 7.

0.2 wt. % ceria-coated silica particles, very low concentration of biocide, and DI water were used in all compositions. All compositions had same pH values at around 5.35.

TABLE 7

Effects of Surfynol? FS-85 Conc. on Oxide
Trench Dishing (Å) vs OP Times (Sec.)

| Compositions | OP Times (Sec.) | 100 um pitch dishing | 200 um pitch dishing | 1000 um pitch dishing |
| --- | --- | --- | --- | --- |
| 0.2% Ceria-coated Silica + 0.28% Maltitol | 0 | 47 | 182 | 410 |
| | 60 | 164 | 327 | 653 |
| | 120 | 284 | 476 | 874 |
| 0.2% Ceria-coated Silica + 0.28% Maltitol + 0.006% Surfynol ® FS-85 | 0 | 59 | 166 | 404 |
| | 60 | 110 | 225 | 506 |
| | 120 | 173 | 307 | 635 |
| 0.2% Ceria-coated Silica + 0.28% Maltitol + 0.012% Surfynol ® FS-85 | 0 | 84 | 172 | 457 |
| | 60 | 133 | 216 | 569 |
| | 120 | 193 | 280 | 684 |
| 0.2% Ceria-coated Silica + 0.28% Maltitol + 0.024% Surfynol ® FS-85 | 0 | 47 | 161 | 482 |
| | 60 | 98 | 247 | 576 |
| | 120 | 151 | 309 | 662 |

Maltitol was used at 0.28 wt. %, and Surfynol® FS-85 was used at 0.006 wt. % or 0.012 wt. % or 0.024 wt. % respectively in the testing samples.

The polishing parts and conditions were: Dow's IK4250UH polishing pad, 2.0 psi DF, ex-situ conditioning and with 87/93 rpm table/head speeds.

The effects of Surfynol® type of surfactant at different concentrations on the oxide trenching dishing vs different over polishing times were tested and the results were listed in Table 7.

As the results shown in Table 7, the use of dual chemical additives i.e., the addition of the second chemical additive, Surfynol® FS-85 at different concentrations in the polishing compositions further reduced oxide trench dishing across different sized features and improved over polishing window stability.

The effects of Surfynol® FS-85 additive concentrations on the oxide trenching loss rates (Å/sec.) were tested and the results were listed in Table 8.

TABLE 8

Effects of Surfynol ® FS-85 Conc.
on Oxide Trench Loss Rates (Å/sec.)

| Compositions | P100 Oxide Trench Loss Rate (ang./sec.) | P200 Oxide Trench Loss Rate (ang./sec.) | P1000 Oxide Trench Loss Rate (ang./sec.) |
| --- | --- | --- | --- |
| 0.2% Ceria-coated Silica + 0.28% Maltitol | 2.9 | 3.5 | 4.8 |
| 0.2% Ceria-coated Silica + 0.28% Maltitol +0.006% Surfynol ® FS-85 | 1.7 | 2.0 | 2.6 |
| 0.2% Ceria-coated Silica + 0.28% Maltitol + 0.012% Surfynol ® FS-85 | 1.7 | 1.6 | 2.2 |
| 0.2% Ceria-coated Silica + 0.28% Maltitol + 0.024% Surfynol ® FS-85 | 1.6 | 1.7 | 2.3 |

As the results shown in Table 8, the use of dual chemical additives i.e., the addition of Surfynol® FX-85 at three different concentrations as Group I chemical additive in the polishing compositions reduced oxide trench loss rates across different sized oxide trench features.

The polishing conditions used for patterned wafer polishing are:
Dow's IK4250UH pad with 2.0 psi down force with table/head speeds at 87/93 rpm, and with ex-situ conditioning.

The effects of Surfynol® FS-85 concentrations on the SiN loss rates (Å/sec.) on different sized patterned features were tested and the results were listed in Table 9.

TABLE 9

Effects of Surfynol® FS-85 Conc. on SiN Loss Rates (Å/sec.)

| Compositions | P100 SiN Loss Rate (ang./sec.) | P200 SiN Loss Rate (ang./sec.) | P1000 SiN Loss Rate (ang./sec.) |
| --- | --- | --- | --- |
| 0.2% Ceria-coated Silica + 0.28% Maltitol | 0.8 | 0.9 | 0.9 |
| 0.2% Ceria-coated Silica + 0.28% Maltitol + 0.006% Surfynol® FS-85 | 0.6 | 0.7 | 0.7 |
| 0.2% Ceria-coated Silica + 0.28% Maltitol + 0.012% Surfynol FS-85 | 0.6 | 0.5 | 0.5 |
| 0.2% Ceria-coated Silica + 0.28% Maltitol + 0.024% Surfynol® FS-85 | 0.6 | 0.5 | 0.6 |

As the results shown in Table 9, the use of dual chemical additives i.e., the addition of Surfynol® FX-85 at three different concentrations as the chemical additive in the polishing compositions reduced SiN loss rates across different sized patterned features.

The effects of Surfynol® FS-85 concentrations on the oxide trenching dishing rates (Å/sec.) were tested and the results were listed in Table 10.

As the results shown in Table 10, the use of dual chemical additives i.e., the addition of Surfynol® FS-85 at three different concentrations as the chemical additive in the polishing compositions reduced oxide trench dishing rates across different sized oxide trench features.

TABLE 10

Effects of Surfynol® FS-85 Conc. on Oxide Trench Dishing Rates (Å/sec.)

| Compositions | P100 Oxide Trench Dishing Rate (ang./sec.) | P200 Oxide Trench Dishing Rate (ang./sec.) | P1000 Oxide Trench Dishing Rate (ang./sec.) |
| --- | --- | --- | --- |
| 0.2% Ceria-coated Silica + 0.28% Maltitol | 2.0 | 3.5 | 4.8 |
| 0.2% Ceria-coated Silica + 0.28% Maltitol + 0.006% Surfynol® FS-85 | 1.0 | 2.0 | 2.6 |
| 0.2% Ceria-coated Silica + 0.28% Maltitol + 0.012% Surfynol® FS-85 | 0.9 | 1.6 | 2.2 |
| 0.2% Ceria-coated Silica + 0.28% Maltitol + 0.024% Surfynol® FS-85 | 0.9 | 1.2 | 2.3 |

Example 5

In Example 5, the polishing compositions used for polishing and two different polishing down forces were shown in Table 11.

0.2 wt. % ceria-coated silica particles, very low concentration of biocide, and DI water were used in all compositions. All compositions had same pH values at around 5.35.

Maltitol was used at 0.28 wt. %, and Surfynol® FS-85 was used at 0.012 wt. % respectively in the testing samples.

The removal rates (RR at Å/min) for different films at two different down forces (2.0 psi or 3.0 psi) were tested. The effects of dual chemical additives on the film removal rates and TEOS:SiN selectivity were observed and listed in Table 11.

The polishing parts and conditions were: Dow's IK4250UH polishing pad, 2.0 psi DF or 3.0 psi DF, ex-situ conditioning and with 87/93 rpm table/head speeds.

TABLE 11

Effects of Surfynol® FS-85 at Different DF (psi) on Film RR (Å/min.) & TEOS:SiN Selectivity

| Down Force | Compositions | TEOS-RR (ang./min) | HDP-RR (ang./min) | PECVD SiN-RR (ang./min) | LPCVD SiN-RR (ang./min) | TEOS:PECVD SiN Selectivity |
| --- | --- | --- | --- | --- | --- | --- |
| 3 psi | 0.2% Ceria Coated Silica + 0.28% Maltitol | 6045 | 5920 | 99 | 51 | 61:1 |
|  | +0.012% Surfynol® FS-85 | 5725 | 5817 | 44 | 42 | 130:1 |
| 2 psi | 0.2% Ceria Coated Silica + 0.28% Maltitol | 4637 | 4364 | 49 | 36 | 95:1 |
|  | +0.012% Surfynol® FS-85 | 3808 | 3747 | 29 | 26 | 131:1 |

As the results shown in Table 11, with the same concentrations of dual chemical additives at different polishing down force(DF) conditions, the PECVD or LPCVD SiN film removal rates were suppressed at both down force polishing conditions. TEOS: PECVD SiN selectivity was increased significantly, and 3.0 psi DF provided more increasing than at 2.0 psi DF.

The effects of dual chemical additive at same concentrations and at different down force conditions on the oxide trench dishing were observed and listed in Table 12.

The polishing parts and conditions were: Dow's IK4250UH polishing pad, 2.0 psi DF or 3.0 psi DF, ex-situ conditioning and with 87/93 rpm table/head speeds.

As the results shown in Table 12, the oxide trench dishing at various sized features were reduced at both down force polishing conditions. Also, the over polishing window stability were improved using dual chemical additives at 3.0 psi DF or at 2.0 psi DF.

TABLE 12

Effects of Surfynol ® FS-85 at Different DF (psi) on Oxide Trench Dishing (A/)

| Down Force | Compositions | Over Polish Times (Sec.) | 100 um pitch dishing | 200 um pitch dishing | 1000 um pitch dishing |
|---|---|---|---|---|---|
| 3 psi | 0.2% Ceria Coated Silica + 0.28% Maltitol | 0 | 52 | 165 | 420 |
| | | 60 | 267 | 423 | 913 |
| | | 120 | 438 | 648 | 1355 |
| 3 psi | +0.012% Surfynol ® FS-85 | 0 | 56 | 186 | 536 |
| | | 60 | 197 | 366 | 829 |
| | | 120 | 316 | 511 | 1137 |
| 2 psi | 0.2% Ceria Coated Silica + 0.28% Maltitol | 0 | 47 | 182 | 410 |
| | | 60 | 164 | 327 | 653 |
| | | 120 | 284 | 476 | 874 |
| 2 psi | +0.012% Surfynol ® FS-85 | 0 | 84 | 172 | 457 |
| | | 60 | 133 | 216 | 569 |
| | | 120 | 193 | 280 | 684 |

More polishing testing were also conducted with various Surfynol® based surfactants.

The effects of Surfynol® type additives on the film removal rates and TEOS:SiN selectivity were listed in Table 13.

The polishing tests were conducted using Dow's IK4250UH pad with 2.0 spi DF and 87/93 rpm table/head speeds.

TABLE 13

Effects of Surfynol ® Type Additives at Different DF (psi) on Film RR (A/min.) & TEOS:SiN Selectivity

| Compositions | TEOS-RR (ang./min) | HDP-RR (ang./min) | PECVD SiN-RR (ang./min) | TEOS:SiN Selectivity |
|---|---|---|---|---|
| 0.2% Ceria-coated Silica + 0.28% Maltitol | 3052 | 2857 | 43 | 71:1 |
| +0.012 × Surfynol ® FS85 Surfactant | 3501 | 3432 | 35 | 100:1 |
| +0.012 × Surfynol ® 465 Surfactant | 3840 | 3326 | 36 | 107:1 |
| +0.012 × Surfynol ® 485 Surfactant | 2285 | 2561 | 33 | 69:1 |
| +0.012 × Surfynol ® SE Surfactant | 4270 | 3714 | 32 | 133:1 |
| +0.012 × Surfynol ® SE-F Surfactant | 3914 | 3545 | 43 | 91:1 |

As the results shown in Table 13, with the same concentrations of different Surfynol® chemical additives, TEOS:SiN selectivity were increased for most Surfynol® chemical additives.

The effects of various Surfynol® surfactants as chemical additives at same concentrations on the oxide trench dishing at different sized features vs different over polishing times were observed and listed in Table 14.

TABLE 14

Effects of Surfynol ® Type Additives on Oxide Trench Dishing (A)

| Compositions | Over Polish Times (Sec.) | 100 um pitch dishing | 200 um pitch dishing | 1000 um pitch dishing |
|---|---|---|---|---|
| 0.2% Ceria Coated Silica + 0.28% Maltitol | 0 | 325 | 576 | 1220 |
| | 60 | 365 | 617 | 1336 |
| | 120 | 414 | 667 | 1403 |
| +0.012% Surfynol ® FS-85 | 0 | 250 | 425 | 923 |
| | 60 | 289 | 483 | 1008 |
| | 120 | 343 | 555 | 1146 |
| +0.012 × Surfynol ® 465 Surfactant | 0 | 332 | 493 | 1108 |
| | 60 | 381 | 545 | 1223 |
| | 120 | 423 | 616 | 1304 |
| +0.012 × Surfynol ® 485 Surfactant | 0 | 233 | 414 | 981 |
| | 60 | 273 | 469 | 1020 |
| | 120 | 311 | 514 | 1096 |
| +0.012 × Surfynol ® SE Surfactant | 0 | 161 | 372 | 888 |
| | 60 | 229 | 426 | 1017 |
| | 120 | 292 | 533 | 1113 |
| +0.012 × Surfynol ® SE-F Surfactant | 0 | 284 | 505 | 1178 |
| | 60 | 361 | 600 | 1294 |
| | 120 | 428 | 700 | 1453 |

The polishing parts and conditions were: Dow's IK4250UH polishing pad, 2.0 psi DF, ex-situ conditioning and with 87/93 rpm table/head speeds.

As the results shown in Table 14, with the same concentrations of different Surfynol® chemical additives, the oxide trench dishing with various sized features were reduced to certain degrees for most Surfynol® chemical additives.

Example 6

In Example 6, the polishing compositions used for oxide polishing were shown in Table 15.

0.2 wt. % ceria-coated silica particles, very low concentration of biocide, and DI water were used in all compositions. All compositions had same pH values at around 5.35.

D-Sorbitol was used at 0.15 wt. %, and Dynol™ 607 was used at 0.05 wt. % in the testing samples.

The removal rates (RR at Å/min) for different films were tested with Dow's IC1010 pad and at 3.1 psi applied down force.

The effects of dual chemical additives on the film removal rates and TEOS:SiN film selectivity were observed and listed in Table 15.

TABLE 15

Effects of Chemical Additives on Film
RR (Å/min.) & TEOS:SiN Selectivity

| Compositions | TEOS RR (Å/min.) | HDP RR (Å/min.) | PECVD SiN RR (Å/min.) | TEOS:SiN Selectivity |
|---|---|---|---|---|
| 0.2% Ceria-coated Silica + 0.15% D-Sorbitol | 2387 | 2301 | 77 | 31:1 |
| 0.2% Ceria-coated Silica + 0.15% D-Sorbitol + 0.05% Dynol™ 607 | 1797 | 1755 | 45 | 40:1 |

As the results shown in Table 15, the use of dual chemical additives i.e., the addition of Dynol™ based surfactant molecule in the polishing composition effectively suppressed SiN film removal rates. The TEOS:SiN selectivity was increased.

The effects of dual chemical additives on the oxide trenching dishing vs different over polishing times were tested and the results were listed in Table 16.

As the results shown in Table 16, the use of dual chemical additives i.e., the addition of Dynol™ 607 as the chemical additive in the polishing compositions provided very low oxide trench dishing vs different over polishing times.

TABLE 16

Effects of Chemical Additives on Oxide
Trench Dishing (Å) vs OP Times (Sec.)

| Compositions | OP Times (Sec.) | 100 μm Pitch Dishing (Å) | 200 μm Pitch Dishing (Å) | HDP RR (Å) |
|---|---|---|---|---|
| 0.2% Ceria-coated Silica + 0.15% D-Sorbitol | 0 | 95 | 234 | 2301 |
| | 60 | 205 | 342 | |
| | 120 | 317 | 451 | |
| 0.2% Ceria-coated Silica + 0.15% D-Sorbitol + 0.05% Dynol™ 607 | 0 | 107 | 241 | 1755 |
| | 60 | 186 | 339 | |
| | 120 | 303 | 449 | |

The effects of dual chemical additives on the SiN loss rates (Å/sec.) on different sized patterned features were tested and the results were listed in Table 17.

TABLE 17

Effects of Dual Chemical Additives on SiN Loss Rates (Å/sec.)

| Compositions | P100 SiN Loss Rate (Å/sec.) | P200 SiN Loss Rate (Å/sec.) |
|---|---|---|
| 0.2% Ceria-coated Silica + 0.15% D-Sorbitol | 1.0 | 0.9 |
| 0.2% Ceria-coated Silica + 0.15% D-Sorbitol + 0.05% Dynol™ 607 | 0.7 | 0.6 |

As the results shown in Table 17, the use of dual chemical additives i.e., the addition of Dynol™ 607 as the chemical additive in the polishing compositions reduced SiN loss rates across different sized patterned features.

Example 7

In Example 7, the polishing compositions used for oxide polishing were shown in Table 18. All compositions had 0.4 wt. % ceria-coated silica particles, very low concentration of biocide, and DI water. All polishing compositions had same pH values at around 5.35.

D-Sorbitol was used at 0.275 wt. %, and Dynol™ 607 was used at 0.01 wt. % in the testing samples.

The removal rates (RR at Å/min) for different films were tested with Dow's IC1010 pad and at 3.1 psi applied down force. The effects of chemical additives on the film removal rates and TEOS:SiN film selectivity were observed and listed in Table 18.

TABLE 18

Effects of Additives on Film RR (Å/min.) & TEOS:SiN Selectivity

| Compositions | TEOS RR (Å/min.) | HDP RR (Å/min.) | PECVD SiN RR (Å/min.) | TEOS:SiN Selectivity |
|---|---|---|---|---|
| 0.4% Ceria-coated Silica + 0.01% Dynol™ 607 | 4006 | 3362 | 462 | 9:1 |
| 0.4% Ceria-coated Silica + 0.275% D-Sorbitol | 4531 | 4220 | 104 | 44:1 |
| 0.4% Ceria-coated Silica + 0.275% D-Sorbitol + 0.01% Dynol™ 607 | 4154 | 3944 | 53 | 78:1 |

When Dynol™ 607 was used alone in the polishing composition, low TEOS:SiN selectivity at about 9:1 was obtained.

When D-Sorbitol was used alone in the polishing composition, TEOS:SiN selectivity at about 44:1 was obtained.

When the polishing composition having the combination of D-Sorbitol and Dynol™ 607, i.e., dual chemical additives; TEOS:SiN removal selectivity was unexpectedly increased to 78:1.

The effects of chemical additives on the oxide trenching dishing vs different over polishing times were tested and the results were listed in Table 19.

TABLE 19

Effects of Chemical Additives on Oxide
Trench Dishing (Å) vs OP Times (Sec.)

| Compositions | OP Times (Sec.) | 100 μm Pitch Dishing (Å) | 200 μm Pitch Dishing (Å) | HDP RR (Å) |
|---|---|---|---|---|
| 0.4% Ceria-coated Silica + 0.01% Dynol™ 607 | 0 | 37 | 121 | 3362 |
| | 60 | 785 | 936 | |
| | 120 | 1202 | 1492 | |
| 0.4% Ceria-coated Silica + 0.275% D-Sorbitol | 0 | 202 | 362 | 4220 |
| | 60 | 305 | 527 | |
| | 120 | 457 | 719 | |
| 0.4% Ceria-coated Silica + 0.275% D-Sorbitol + 0.01% Dynol™ 607 | 0 | 180 | 337 | 3944 |
| | 60 | 238 | 412 | |
| | 120 | 311 | 475 | |

As the results shown in Table 19, at 60 sec. and 120 sec. over polishing time conditions, the polishing compositions containing both Dynol™ 607 and D-sorbitol as dual chemical additives provided lower oxide trench dishing across two tested oxide trench features than those oxide trench dishing obtained from the polishing compositions either using Dynol™ 607 or D-sorbitol as the only chemical additive respectively.

Also shown in Table 19, the additions of Dynol™ 607 and D-sorbitol as the dual chemical additives in the polishing compositions provided very low oxide trench dishing vs different over polishing times and shown the significant oxide trench dishing reductions across different patterned features vs over polishing times.

The effects of chemical additives on the SiN loss rates (Å/sec.) on different sized patterned features were tested and the results were listed in Table 20.

TABLE 20

Effects of Chemical Additives on SiN Loss Rates (Å/sec.)

| Compositions | P100 SiN Loss Rate (Å/sec.) | P200 SiN Loss Rate (Å/sec.) |
|---|---|---|
| 0.4% Ceria-coated Silica + 0.01% Dynol™ 607 | 11.5 | 10.4 |
| 0.4% Ceria-coated Silica + 0.275% D-Sorbitol | 1.6 | 1.6 |
| 0.4% Ceria-coated Silica + 0.275% D-Sorbitol + 0.01% Dynol™ 607 | 0.8 | 0.8 |

As the results shown in Table 20, the addition of dual chemical additives in the polishing compositions significantly reduced SiN loss rates across different sized patterned features.

The effects of chemical additives on the oxide trench loss rates (Å/sec.) on different sized patterned features were tested and the results were listed in Table 21.

As the results shown in Table 21, the addition of dual chemical additives in the polishing compositions significantly reduced oxide trench loss rates across different sized patterned features.

TABLE 21

Effects of Chemical Additives on Oxide Trench Loss Rates (Å/sec.)

| Compositions | P100 Oxide Trench Loss Rate (Å/sec.) | P200 Oxide Trench Loss Rate (Å/sec.) |
|---|---|---|
| 0.4% Ceria-coated Silica + 0.01% Dynol™ 607 | 19.4 | 21.9 |
| 0.4% Ceria-coated Silica + 0.275% D-Sorbitol | 4.1 | 4.7 |
| 0.4% Ceria-coated Silica + 0.275% D-Sorbitol + 0.01% Dynol™ 607 | 2.0 | 2.2 |

The effects of chemical additives on the oxide trench dishing rates (Å/sec.) on different sized patterned features were tested and the results were listed in Table 22.

TABLE 22

Effects of Chemical Additives on Oxide Trench Dishing Rates (Å/sec.)

| Compositions | P100 Oxide Trench Dishing Rate (Å/sec.) | P200 Oxide Trench Dishing Rate (Å/sec.) |
|---|---|---|
| 0.4% Ceria-coated Silica + 0.01% Dynol™ 607 | 9.7 | 11.4 |
| 0.4% Ceria-coated Silica + 0.275% D-Sorbitol | 2.1 | 3.0 |
| 0.4% Ceria-coated Silica + 0.275% D-Sorbitol + 0.01% Dynol™ 607 | 1.1 | 1.2 |

As the results shown in Table 22, the addition of dual chemical additives in the polishing compositions significantly reduced oxide trench dishing rates across different sized patterned features.

Example 8

In Example 8, the polishing compositions used for oxide polishing were shown in Table 23. 0.2 wt. % ceria-coated silica particles, very low concentration of biocide, and DI water were used in all compositions. All compositions had same pH values at around 5.35.

Maltitol was used at 0.28 wt. %, and Surfynol® FS-85 was used at 0.012 wt. % in the testing samples.

The removal rates (RR at Å/min) for different films were tested with Dow's IC1010 pad and at 3.1 psi applied down force. The effects of chemical additive maltitol/or Surfynol® FS-85 or maltitol plus Surfynol® FS-85 on the film removal rates and TEOS:SiN film selectivity were observed and listed in Table 23.

TABLE 23

Effects of Maltitol/Surfynol FS-85 on Film RR (Å/min.) & TEOS:SiN Selectivity

| Compositions | TEOS RR (Å/min.) | HDP RR (Å/min.) | PECVD SiN RR (Å/min.) | TEOS:SiN Selectivity |
|---|---|---|---|---|
| 0.2% Ceria-coated Silica + 0.28% Maltitol | 2737 | 2603 | 114 | 24:1 |
| 0.2% Ceria-coated Silica + 0.012% Surfynol® FS-85 | 2894 | 1966 | 326 | 9:1 |
| 0.2% Ceria-coated Silica + 0.28% Maltitol + 0.012% Surfynol® FS-85 | 2839 | 2606 | 39 | 73:1 |

As the results shown in Table 23, when Surfynol® FS-85 surfactant was used together with maltitol in the polishing composition, the polishing composition effectively suppressed SiN film removal rates while comparing the SiN film removal rates obtained when using Surfynol® FS-85 or maltitol as single chemical additive in the polishing compositions respectively. The TEOS:SiN selectivity was increased when both Surfynol® FS-85 and maltitol were used as dual chemical additives.

Specifically, when both Surfynol® FS-85 and maltitol were used together as the dual chemical additives in the polishing composition, TEOS:SiN selectivity was increased from 24:1 for using maltitol alone or 8:1 for using Surfynol® FS-85 alone to 73:1.

The effects of Surfynol® FS-85 and maltitol on the oxide trenching dishing vs different over polishing times were tested and the results were listed in Table 24.

TABLE 24

Effects of Surfynol FS-85/Maltitol on Oxide Trench Dishing (Å) vs OP Times (Sec.)

| Compositions | OP Times (Sec.) | 100 µm Pitch Dishing (Å) | 200 µm Pitch Dishing (Å) | HDP RR (Å/min.) |
|---|---|---|---|---|
| 0.2% Ceria-coated Silica + 0.28% Maltitol | 0 | 404 | 566 | 2603 |
| | 60 | 554 | 769 | |
| | 120 | 681 | 917 | |
| 0.2% Ceria-coated | 0 | 81 | 220 | 1966 |

TABLE 24-continued

Effects of Surfynol FS-85/Maltitol on Oxide
Trench Dishing (Å) vs OP Times (Sec.)

| Compositions | OP Times (Sec.) | 100 μm Pitch Dishing (Å) | 200 μm Pitch Dishing (Å) | HDP RR (Å/min.) |
|---|---|---|---|---|
| Silica + 0.012% Surfynol ® FS-85 | 60 | 577 | 731 | |
| | 120 | 941 | 1171 | |
| 0.2% Ceria-coated Silica + 0.28% Maltitol | 0 | 57 | 167 | 2606 |
| | 60 | 151 | 272 | |
| 0.2% Ceria-coated Silica + 0.28% Maltitol + 0.012% Surfynol ® FS-85 | 120 | 273 | 399 | |

As the results shown in Table 24, the additions of Surfynol® FS-85 and maltitol as the dual chemical additives in the same polishing compositions provided very low oxide trench dishing vs different over polishing times and shown the significant oxide trench dishing reductions across different patterned features vs over polishing times.

Under 60 sec. or 120 sec. over polishing time conditions, the polishing composition containing both Surfynol® FS-85 and maltitol as dual chemical additives provided much lower oxide trench dishing across two tested oxide trench features than those oxide trench dishing obtained from the polishing compositions either using Surfynol® FS-85 or maltitol as the only chemical additive respectively.

The effects of Surfynol® FS-85 surfactant and maltitol on the SiN loss rates (Å/sec.) on different sized patterned features were tested and the results were listed in Table 25.

As the results shown in Table 25, the addition of Surfynol® FS-85 and maltitol as the dual chemical additives in the same polishing compositions significantly reduced SiN loss rates across different sized patterned features, and provided much lower SiN loss rates across two tested patterned features than those SiN loss rates obtained from the polishing compositions either using Surfynol® FS-85 or maltitol as the only chemical additive respectively in the polishing compositions.

TABLE 25

Effects of Surfynol ® FS-85/Maltitol Additives
on SiN Loss Rates (Å/sec.)

| Compositions | P100 SiN Loss Rate (Å/sec.) | P200 SiN Loss Rate (Å/sec.) |
|---|---|---|
| 0.2% Ceria-coated Silica + 0.28% Maltitol | 1.6 | 1.6 |
| 0.2% Ceria-coated Silica + 0.012% Surfynol ® FS-85 | 6.3 | 6.0 |
| 0.2% Ceria-coated Silica + 0.28% Maltitol + 0.012% Surfynol ® FS-85 | 0.7 | 0.6 |

The effects of Surfynol® FS-85 surfactant and maltitol on the oxide trench loss rates (Å/sec.) on different sized patterned features were tested and the results were listed in Table 26.

TABLE 26

Effects of Surfynol ® FS-85 and Maltitol on
Oxide Trench Loss Rates (Å/sec.)

| Compositions | P100 Oxide Trench Loss Rate (Å/sec.) | P200 Oxide Trench Loss Rate (Å/sec.) |
|---|---|---|
| 0.2% Ceria-coated Silica + 0.28% Maltitol | 4.1 | 4.6 |
| 0.2% Ceria-coated Silica + 0.012% Surfynol ® FS-85 | 13.6 | 14.1 |
| 0.2% Ceria-coated Silica + 0.28% Maltitol + 0.012% Surfynol ® FS-85 | 2.6 | 2.8 |

As the results shown in Table 26, the addition of Surfynol® FS-85 and maltitol as the dual chemical additives in the same polishing compositions significantly reduced oxide trench loss rates across different sized patterned features, and provided much lower oxide trench loss rates across two tested patterned features than those oxide trench loss rates obtained from the polishing compositions either using Surfynol® FS-85 or maltitol as the only chemical additive in the polishing compositions respectively.

The effects of Surfynol® FS-85 surfactant and maltitol on the oxide trench dishing rates (Å/sec.) on different sized patterned features were tested and the results were listed in Table 27.

As the results shown in Table 27, the addition of Surfynol® FS-85 and maltitol as the dual chemical additives in the same polishing compositions significantly reduced oxide trench dishing rates across different sized patterned features, and provided lower oxide trench dishing rates across two tested patterned features than those oxide trench dishing rates obtained from the polishing compositions either using Surfynol® FS-85 or maltitol as the only chemical additive respectively.

TABLE 27

Effects of Surfynol ® FS-85 & Maltitol on
Oxide Trench Dishing Rates (Å/sec.)

| Compositions | P100 Oxide Trench Dishing Rate (Å/sec.) | P200 Oxide Trench Dishing Rate (Å/sec.) |
|---|---|---|
| 0.2% Ceria-coated Silica + 0.28% Maltitol | 2.3 | 2.9 |
| 0.2% Ceria-coated Silica + 0.012% Surfynol ® FS-85 | 7.2 | 7.9 |
| 0.2% Ceria-coated Silica + 0.28% Maltitol + 0.012% Surfynol ® FS-85 | 1.8 | 1.9 |

The working examples have demonstrated that the use of both Group I and Group II as dual chemical additives in the polishing compositions, TEOS:SiN removal selectivity was greatly increased. Furthermore, oxide trench dishing rates, oxide trench loss rates, and SiN loss rates were greatly reduced across tested patterned features.

The embodiments of this invention listed above, including the working example, are exemplary of numerous embodiments that may be made of this invention. It is contemplated that numerous other configurations of the process may be used, and the materials used in the process may be elected from numerous materials other than those specifically disclosed.

The invention claimed is:

1. A chemical mechanical polishing composition comprising:
   ceria-coated inorganic oxide particles;
   an organic acetylene molecule containing an acetylene bond and having at least two ethoxylate functional groups having terminal hydroxyl groups;
   an organic molecule having at least two hydroxyl functional groups in the same molecule;
   water soluble solvent; and
   optionally
   biocide; and
   pH adjuster;
   wherein
   the organic acetylene molecule containing an acetylene bond and at least two ethoxylate functional groups with terminal hydroxyl groups comprises non-ionic surfactant comprising ethoxylated acetylene glycol;
   the organic molecule having at least two hydroxyl functional groups in the same molecule is selected from the group consisting of maltitol, lactitol, maltotritol, ribitol, D-sorbitol, mannitol, dulcitol, iditol, D-(-)-Fructose, sorbitan, sucrose, ribose, Inositol, glucose, D-arabinose, L-arabinose, D-mannose, L-mannose, meso-erythritol, beta-lactose, arabinose, and combinations thereof; and
   the composition has a pH of 4 to 9.

2. The chemical mechanical polishing composition of claim 1, wherein
   the ceria-coated inorganic oxide particles are selected from the group consisting of ceria-coated colloidal silica, ceria-coated high purity colloidal silica, ceria-coated alumina, ceria-coated titania, ceria-coated zirconia particles and combinations thereof;
   the water soluble solvent is selected from the group consisting of deionized (DI) water, distilled water, and alcoholic organic solvents;
   the biocide comprises active ingredient selected from the group consisting of 5-chloro-2-methyl-4-isothiazolin-3-one, 2-methyl- -isothiazolin-3-one, and combinations thereof; and
   the pH adjusting agent is selected from the group consisting of nitric acid, hydrochloric acid, sulfuric acid, phosphoric acid, other inorganic or organic acids, and mixtures thereof for acidic pH conditions; or selected from the group consisting of sodium hydroxide, potassium hydroxide, ammonium hydroxide, tetraalkyl ammonium hydroxide, organic quaternary ammonium hydroxide compounds, organic amines, and combinations thereof for alkaline pH conditions.

3. The chemical mechanical polishing composition of claim 1, wherein
   the organic molecule having at least two hydroxyl functional groups in the same molecule is selected from the group consisting of maltitol, lactitol, maltotritol, D-sorbitol, mannitol, dulcitol, D-(-)-Fructose, beta-lactose, and combinations thereof.

4. The chemical mechanical polishing composition of claim 1, wherein the composition comprises ceria-coated colloidal silica particles; the non-ionic surfactant comprising ethoxylated acetylene glycol; one selected from the group consisting of maltitol, lactitol, maltotritol, D-sorbitol, mannitol, dulcitol, D-(-)-Fructose, beta-lactose, and combinations thereof; and water.

5. The chemical mechanical polishing composition of any of claims 1, wherein the composition comprises ceria-coated colloidal silica particles; 0.001 wt. % to 0.25 wt. % of the non-ionic surfactant comprising ethoxylated acetylene glycol; 0.0025 wt. % to 1.0 wt. % of one selected from the group consisting of maltitol, lactitol, maltotritol, D-sorbitol, mannitol, dulcitol, D-(-)-Fructose, beta-lactose, and combinations thereof; and water.

6. The chemical mechanical polishing composition of any of claims 1, wherein the composition comprises ceria-coated colloidal silica particles; 0.002 wt. % to 0.15 wt. % of the non-ionic surfactant comprising ethoxylated acetylene glycol; 0.05 wt. % to 0.5 wt. % of one selected from the group consisting of maltitol, lactitol, maltotritol, D-sorbitol, mannitol, dulcitol, D-(-)-Fructose, beta-lactose, and combinations thereof; and water; wherein the composition has a pH of 4.5 to 7.5.

7. A method of chemical mechanical polishing (CMP) a semiconductor substrate comprising at least one silicon oxide film and at least one silicon nitride film, comprising
   providing the semiconductor substrate;
   providing a polishing pad;
   providing a chemical mechanical polishing (CMP) composition comprising:
       ceria-coated inorganic oxide particles;
       an organic acetylene molecule containing an acetylene bond and having at least two
       ethoxylate functional groups having terminal hydroxyl groups;
       an organic molecule having at least two hydroxyl functional groups in the same molecule;
       water soluble solvent; and
       optionally
       biocide; and
       pH adjuster;
       wherein
       the organic acetylene molecule containing an acetylene bond and at least two ethoxylate functional groups with terminal hydroxyl groups comprises non-ionic surfactant comprising ethoxylated acetylene glycol;
       the organic molecule having at least two hydroxyl functional groups in the same molecule is selected from the group consisting of maltitol, lactitol, maltotritol, ribitol, D-sorbitol, mannitol, dulcitol, iditol, D-(-)-Fructose, sorbitan, sucrose, ribose, Inositol, glucose, D-arabinose, L-arabinose, D-mannose, L-mannose, meso-erythritol, beta-lactose, arabinose, and combinations thereof; and
       the composition has a pH of 4 to 9;
   contacting the semiconductor substrate with the polishing pad and the chemical mechanical polishing composition; and
   polishing the at least one silicon oxide film and the at least one silicon nitride film;
   wherein the silicon oxide film is selected from the group consisting of Chemical vapor deposition (CVD), Plasma Enhance CVD (PECVD), High Density Deposition CVD(HDP), or spin on silicon oxide film.

8. The method of claim 7, wherein
   the ceria-coated inorganic oxide particles are selected from the group consisting of ceria-coated colloidal silica, ceria-coated high purity colloidal silica, ceria-coated alumina, ceria- coated titania, ceria-coated zirconia particles and combinations thereof;
   the water soluble solvent is selected from the group consisting of deionized (DI) water, distilled water, and alcoholic organic solvents;

the biocide comprises active ingredient selected from the group consisting of 5-chloro-2-methyl-4-isothiazolin-3-one, 2-methyl- -isothiazolin-3-one, and combinations thereof; and the pH adjusting agent is selected from the group consisting of nitric acid, hydrochloric acid, sulfuric acid, phosphoric acid, other inorganic or organic acids, and mixtures thereof for acidic pH conditions; or selected from the group consisting of sodium hydride, potassium hydroxide, ammonium hydroxide, tetraalkyl ammonium hydroxide, organic quaternary ammonium hydroxide compounds, organic amines, and combinations thereof for alkaline pH conditions.

9. The method of claim 7, wherein the chemical mechanical polishing (CMP) composition comprises ceria-coated colloidal silica particles; the non-ionic surfactant comprising ethoxylated acetylene glycol; one selected from the group consisting of maltitol, lactitol, maltotritol, D-sorbitol, mannitol, dulcitol, D-(−)-Fructose, beta-lactose, and combinations thereof; and water.

10. The method of claim 7, wherein the chemical mechanical polishing (CMP) composition comprises ceria-coated colloidal silica particles; 0.002 wt. % to 0.15 wt. % of the non-ionic surfactant comprising ethoxylated acetylene glycol; 0.05 wt. % to 0.5 wt. % of one selected from the group consisting of maltitol, lactitol, maltotritol, D-sorbitol, mannitol, dulcitol, D-(−)-Fructose, beta-lactose, and combinations thereof; and water; wherein the composition has a pH of 4.5 to 7.5.

11. The method of claim 7; wherein the silicon oxide film is $SiO_2$ film, and removal selectivity of silicon oxide: silicon nitride is greater than 30.

12. A system for chemical mechanical polishing (CMP) a semiconductor substrate having at least one silicon oxide film and at least one silicon nitride film, comprising
a. the semiconductor substrate;
b. a chemical mechanical polishing (CMP) composition comprising:
ceria-coated inorganic oxide particles;
an organic acetylene molecule containing an acetylene bond and having at least two ethoxylate functional groups having terminal hydroxyl groups;
an organic molecule having at least two hydroxyl functional groups in the same molecule;
water soluble solvent; and
optionally
biocide; and
pH adjuster;
wherein
the organic acetylene molecule containing an acetylene bond and at least two ethoxylate functional groups with terminal hydroxyl groups comprises non-ionic surfactant comprising ethoxylated acetylene glycol;
the organic molecule having at least two hydroxyl functional groups in the same molecule is selected from the group consisting of maltitol, lactitol, maltotritol, ribitol, D-sorbitol, mannitol, dulcitol, iditol, D-(−)-Fructose, sorbitan, sucrose, ribose, Inositol, glucose, D-arabinose, L-arabinose, D-mannose, L-mannose, meso-erythritol, beta-lactose, arabinose, and combinations thereof; and
the composition has a pH of 4 to 9;
c. a polishing pad;
wherein the at least one silicon oxide film and at least one silicon nitride film are in contact with the polishing pad and the chemical mechanical polishing (CMP) composition;
wherein the silicon oxide film is selected from the group consisting of Chemical vapor deposition (CVD), Plasma Enhance CVD (PECVD), High Density Deposition CVD (HDP), or spin on silicon oxide film.

13. The system of claim 12, wherein
the ceria-coated inorganic oxide particles are selected from the group consisting of ceria-coated colloidal silica, ceria-coated high purity colloidal silica, ceria-coated alumina, ceria- coated titania, ceria-coated zirconia particles and combinations thereof;
the water soluble solvent is selected from the group consisting of deionized (DI) water, distilled water, and alcoholic organic solvents;
the biocide comprises active ingredient selected from the group consisting of 5-chloro-2- methyl-4-isothiazolin-3-one, 2-methyl- -isothiazolin-3-one, and combinations thereof; and
the pH adjusting agent is selected from the group consisting of nitric acid, hydrochloric acid, sulfuric acid, phosphoric acid, other inorganic or organic acids, and mixtures thereof for acidic pH conditions; or selected from the group consisting of sodium hydride, potassium hydroxide, ammonium hydroxide, tetraalkyl ammonium hydroxide, organic quaternary ammonium hydroxide compounds, organic amines, and combinations thereof for alkaline pH conditions.

14. The system of claim 12, wherein the chemical mechanical polishing (CMP) composition comprises ceria-coated colloidal silica particles; the non-ionic surfactant comprising ethoxylated acetylene glycol; one selected from the group consisting of maltitol, lactitol, maltotritol, D-sorbitol, mannitol, dulcitol, D-(−)-Fructose, beta-lactose, and combinations thereof; and water.

15. The system of claim 12, wherein the chemical mechanical polishing (CMP) composition comprises ceria-coated colloidal silica particles; 0.002 wt. % to 0.15 wt. % of the non-ionic surfactant comprising ethoxylated acetylene glycol; 0.05 wt. % to 0.5 wt. % of one selected from the group consisting of maltitol, lactitol, maltotritol, D-sorbitol, mannitol, dulcitol, D-(−)-Fructose, beta-lactose, and combinations thereof; and water; wherein the composition has a pH of 4.5 to 7.5.

16. The system of claim 12; wherein the silicon oxide film is SiO2 film, and removal selectivity of silicon oxide: silicon nitride is greater than 30.

\* \* \* \* \*